US008809669B2

(12) United States Patent
Beck

(10) Patent No.: US 8,809,669 B2
(45) Date of Patent: Aug. 19, 2014

(54) PHOTOVOLTAIC ARRAYS, IN PART HAVING SWITCHES FOR SHORT-CIRCUITING OF MODULES

(75) Inventor: Bernhard Beck, Volkach OT Dimbach (DE)

(73) Assignee: Adensis GmbH, Dresden (DE)

( * ) Notice: Subject to any disclaimer, the term of this patent is extended or adjusted under 35 U.S.C. 154(b) by 143 days.

(21) Appl. No.: 13/034,117

(22) Filed: Feb. 24, 2011

(65) Prior Publication Data

US 2011/0203635 A1    Aug. 25, 2011

(30) Foreign Application Priority Data

Feb. 24, 2010   (DE) .......................... 10 2010 009 120

(51) Int. Cl.
| | |
|---|---|
| *H02N 6/00* | (2006.01) |
| *H01L 31/042* | (2014.01) |
| *H01L 31/02* | (2006.01) |
| *H02J 3/38* | (2006.01) |

(52) U.S. Cl.
CPC ........... *H01L 31/02021* (2013.01); *H02J 3/383* (2013.01); *Y02E 10/563* (2013.01)
USPC ........................................................ 136/244

(58) Field of Classification Search
CPC ... H01L 31/02021; H02J 3/383; Y02E 10/563
USPC ........................................................ 136/244
See application file for complete search history.

(56) References Cited

U.S. PATENT DOCUMENTS

| | | | | |
|---|---|---|---|---|
| 5,621,300 | A | * | 4/1997 | Sato et al. ..................... 320/101 |
| 2006/0231132 | A1 | * | 10/2006 | Neussner ..................... 136/244 |
| 2008/0147335 | A1 | | 6/2008 | Adest et al. |
| 2010/0001587 | A1 | * | 1/2010 | Casey et al. ..................... 307/80 |
| 2010/0001681 | A1 | * | 1/2010 | Zhang et al. ................... 320/101 |

FOREIGN PATENT DOCUMENTS

| | | | |
|---|---|---|---|
| DE | 3041078 | A * | 6/1982 |
| DE | 3041078 | A1 | 6/1982 |
| DE | 10 2006 060 815 | A1 | 6/2008 |

* cited by examiner

*Primary Examiner* — Eli Mekhlin
(74) *Attorney, Agent, or Firm* — Muncy, Geissler, Olds & Lowe, P.C.

(57) ABSTRACT

A photovoltaic generator is provided that has at least one string of multiple series-connected photovoltaic modules, each of which has a plurality of series-connected photovoltaic cells. One quarter to one half of all photovoltaic modules of the at least one string can be short-circuited by means of a switch. Activation of the switch takes place when a predefined voltage value across the string is exceeded. The shorting switch is only present in some of the arrays making up the photovoltaic generator, which reduces cabling costs. Because of the parallel connection of the arrays, the voltage of the arrays without shorting switches is drawn down to a lower voltage that is safe for the inverter.

11 Claims, 7 Drawing Sheets

PHOTOVOLTAIC ARRAYS, IN PART HAVING SWITCHES FOR SHORT-CIRCUITING OF MODULES

This nonprovisional application claims priority under 35 U.S.C. §119(a) to German Patent Application No. DE 10 2010 009 120.0, which was filed in Germany on Feb. 24, 2010, and which is herein incorporated by reference.

BACKGROUND OF THE INVENTION

1. Field of the Invention

The present invention relates to a photovoltaic generator with an array of multiple parallel-connected strings of series-connected photovoltaic modules, wherein a portion of the photovoltaic modules of a string can be short-circuited by means of a shorting switch, the activation of which takes place when a predefined voltage value across the string is exceeded.

2. Description of the Background Art

Photovoltaic systems of this nature are extremely well known. As a general rule, these systems are constructed such that a plurality of strings are connected in parallel. In these designs, the maximum number of strings is based on the output of the inverter to which the strings are connected. Modern inverters can be designed for a DC input voltage of up to approx. 900 volts.

At the present time, it is customary to construct each string in the system from eight photovoltaic modules, each of which has 60 photovoltaic cells. Thus a total of 480 cells are connected in series with one another. In the open-circuit case, a voltage of 1.5 volts is present at each cell, resulting in a string voltage of 720 volts, which is considerably below the maximum voltage of 1000 volts specified by the manufacturers of the modules. If a higher voltage is present, this can lead to destruction of the modules and the entire system.

During operation of the system, the open-circuit voltage of the cells drops to an operating voltage of approximately 1 to 1.1 volts, so that a voltage between 480 volts and 510 volts is present between the ends of the conventional strings. In the example shown in the figures that follow, an operating voltage of 1 volt per cell is assumed for the sake of simplicity, hence a voltage of 60 volts across a single voltaic module with 60 cells. In the event that the operator of the grid to which the photovoltaic system is connected should disconnect it from the grid for any reason (e.g. a short circuit in the supply cable), the voltage jumps to the aforementioned 720 volts, which is not critical for the modules or the system.

On the other hand, it would be desirable to operate the photovoltaic modules and also the inverter with a voltage higher than 480-510 volts in normal operation, ideally at the maximum permissible voltage of 1000 volts. This is not possible, however, since a voltage of approximately 1500 volts in the open-circuit case would lead to the destruction of the photovoltaic modules, the inverter, and the system.

For operating the photovoltaic system at a higher operating voltage, it is known from DE 3041078 to employ a shorting switch that short-circuits a portion of the modules in the event that an overvoltage arises.

For a large system with hundreds of arrays, however, this measure entails high expenditures for wiring and switches. Some of the arrays are located hundreds of meters apart from one another, and there is an additional need for several kilometers of cable that must be laid and connected.

SUMMARY OF THE INVENTION

It is therefore an object of the present invention to protect a large-scale photovoltaic system from overvoltage in the absence of an AC feed, with a low cabling cost.

This object is attained in accordance with the invention in that, in the case of a large-scale system with a plurality of parallel-connected arrays, the shorting switch is only provided on some of the arrays. Hence, only the arrays that are located near the inverter and the control unit need to be provided with the shorting switch, which results in a significant cable savings. As a result of the reduction of the voltage at one or more arrays, the voltage at the other arrays in the parallel circuit is pulled down to a voltage value that is tolerable for the inverter.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
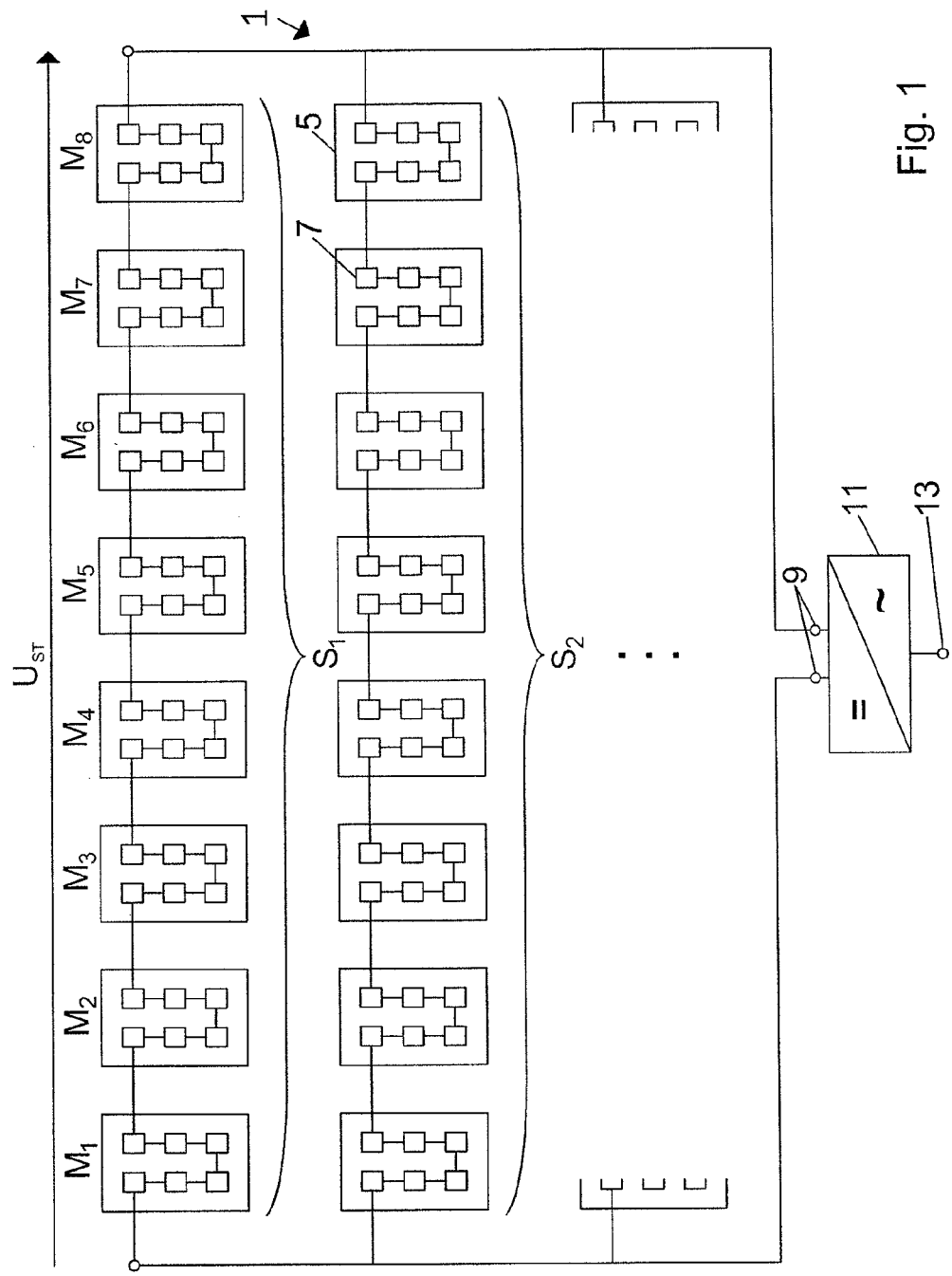
FIG. 1 a schematic representation of a conventional photovoltaic generator with eight modules per string.

Shown in FIG. 1 is an ordinary commercial photovoltaic generator 1, which includes a number of parallel-connected strings S, which in turn include a number—eight in the exemplary embodiment shown—of series-connected photovoltaic modules M. Each photovoltaic module M has series-connected photovoltaic cells 7, as is evident from FIG. 1. For example, it is typical for a photovoltaic module M to use 60 cells with 1.5 volts open-circuit voltage each, or else 130 cells of approx. 0.69 volts each. In both cases, a voltage of approximately 90 volts arises across the module M at open circuit, which is to say approximately 720 volts for eight modules. During operation, this voltage drops to approximately 60 to 65 volts, so that a string voltage Ust of 480 to 510 volts results.

The ends of the parallel-connected strings S are connected to the input 9 of an inverter 11, the output 13 of which feeds the generated electricity into a grid, for example.

The open-circuit voltage of 720 volts is significantly below the currently permissible limit of 1000 volts, which the manufacturers of photovoltaic modules specify as the upper limit for their product. In operation, a correspondingly larger safety margin is achieved relative to the 1000 volts. In the known systems of this type, it would be desirable to fully utilize the maximum permissible voltage of 1000 volts so that the cross-sections of the cables that are to be laid can be kept small.

Figure 1A:
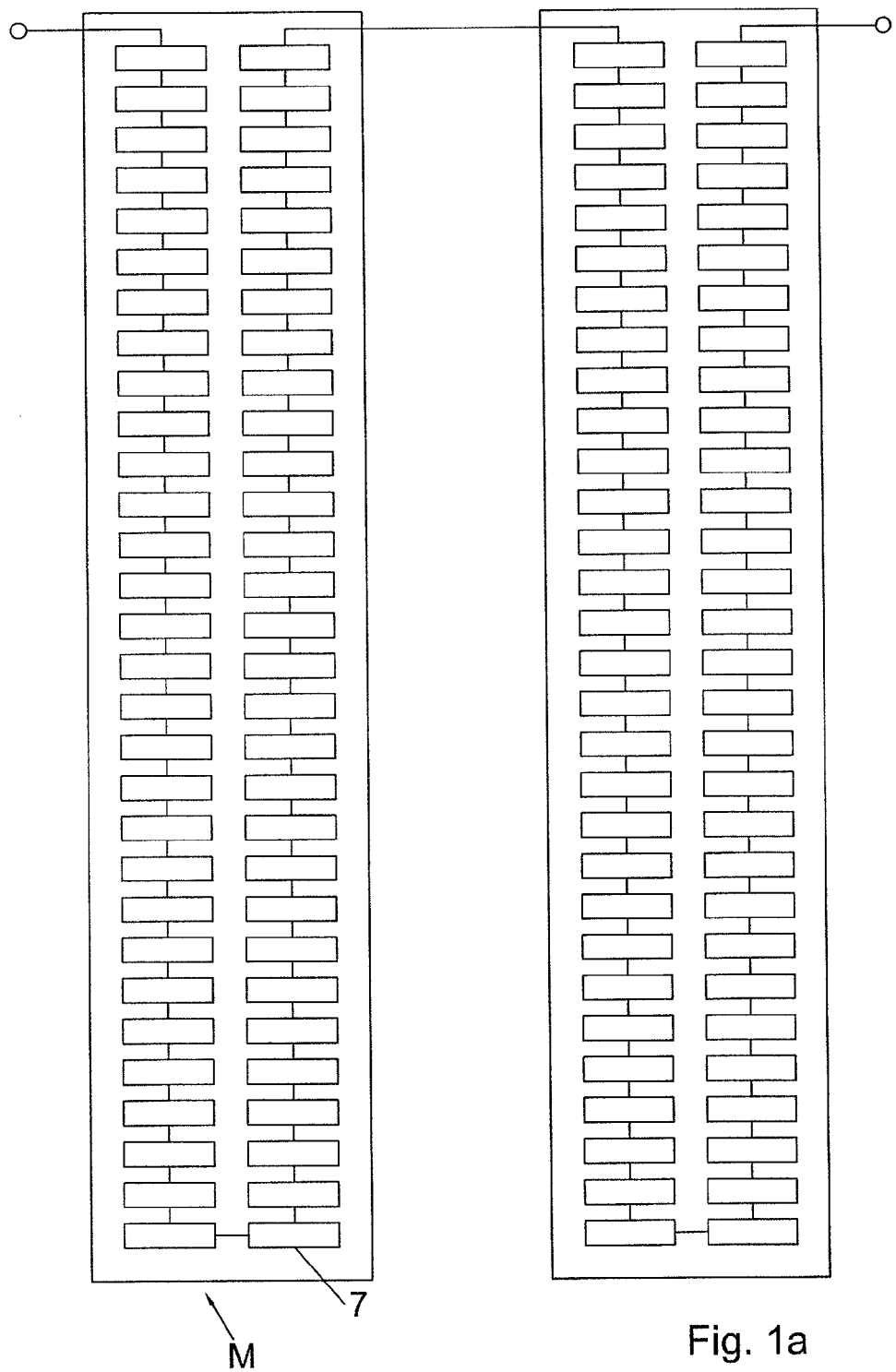
FIG. 1a illustrates a conventional module with 60 photovoltaic cells.
Figure 2:
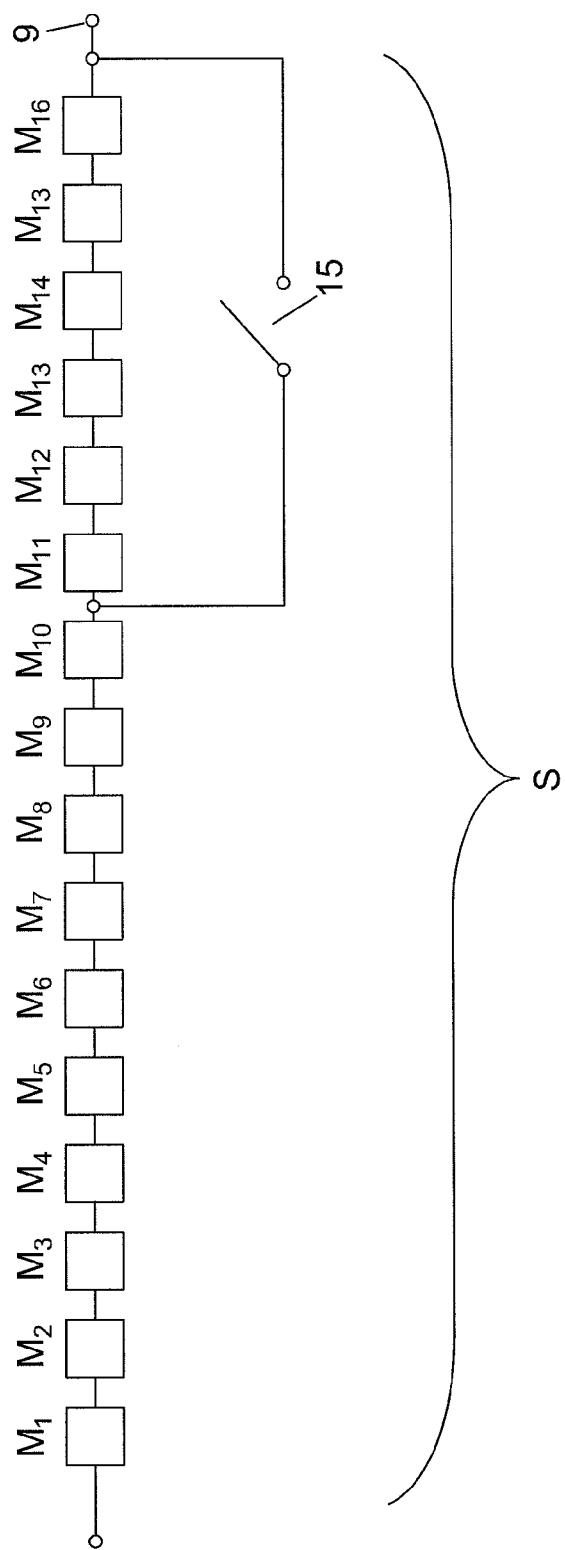
FIG. 2 illustrates a schematic representation of a string with 16 modules.

This purpose is served by the photovoltaic system 1 shown in FIG. 2. Shown there is a single string S, this time with 16 photovoltaic modules M, which is connected in parallel with other strings that are not shown and is routed to the input 9 of the inverter 11. In the example embodiment shown, the string S has double the number of modules M, hence 16, each of which is constructed as shown in FIG. 1a. This results in an impermissibly high open-circuit voltage of 1440 volts across the string S, but a permissibly high operating voltage of 960 to 1020 volts, which are present at one of the modules M and at the input 9 of the inverter 11. Exceeding the permissible level by 20 volts is considered tolerable here.

In order to prevent destruction of the inverter 11 and module M in the event of a disconnection from the grid, a shorting switch 15 is provided. The switch 15 is positioned such that it short-circuits between one tenth and one half, in particular between one quarter and one half, of the modules M. The switch 15 is controlled by a threshold detector (not shown), which detects when the voltage across the string S exceeds the predefinable value, 1000 volts in the example here.

Figure 3:
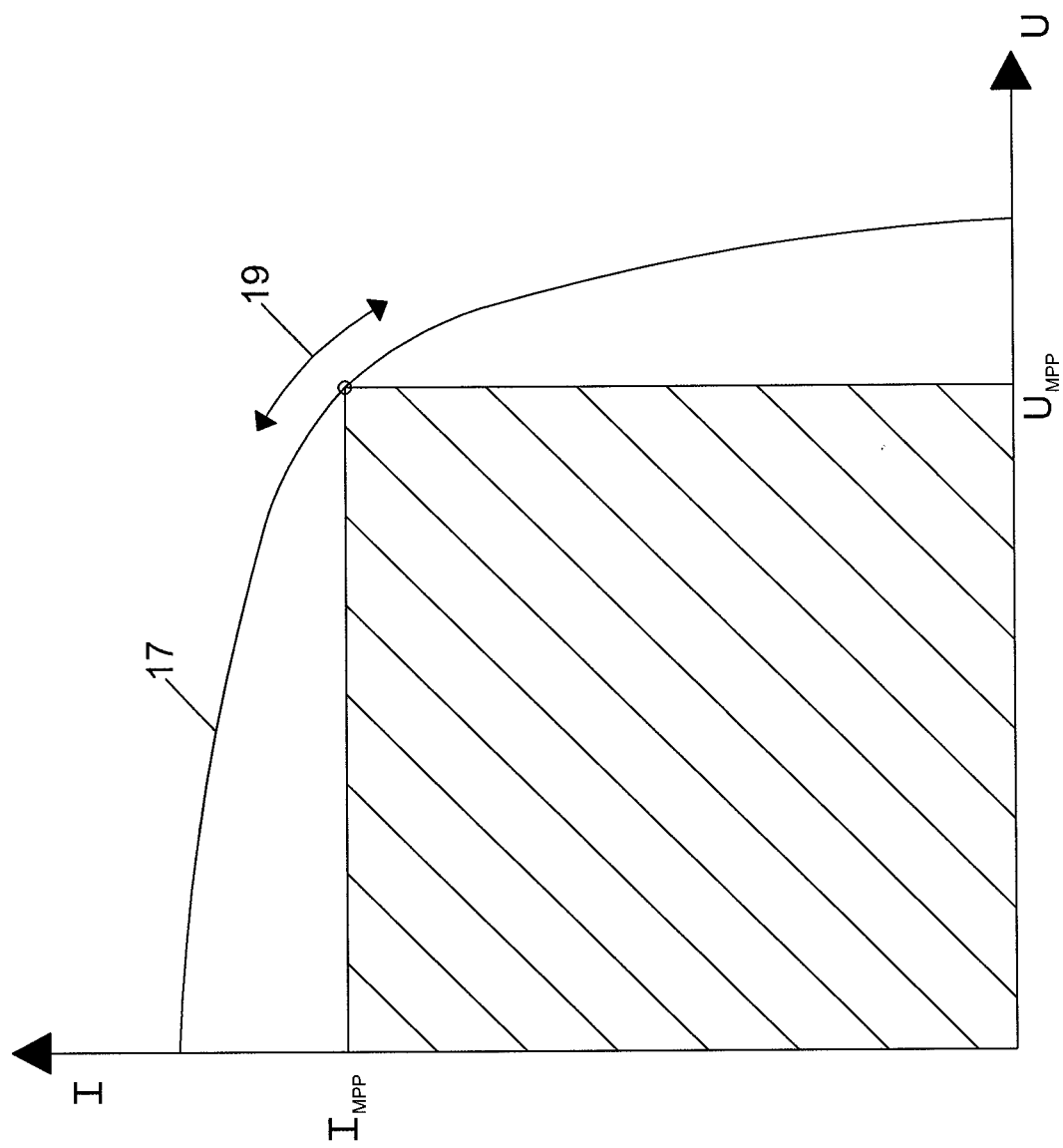
FIG. 3 illustrates a diagram of the method of operation of an MPP regulator.

Another important advantage in daily operation of the photovoltaic generator 1 according to the invention is explained below with reference to FIGS. 3 and 4. FIG. 3 shows the curve of the generated current I as a function of the associated voltage U of a typical photovoltaic system 1. By means of an MPP (Maximum Power Point) regulator, this current/voltage curve 17 is held at a point at which maximum output is present. This maximum output is the product of IMPP and UMPP, and corresponds to the cross-hatched region, which in this case occupies a maximum area. The MPP regulator regulates on the curve 17 along the double-headed arrow 19 and endeavors to move the photovoltaic system to the MPP. This point changes continuously as a function of sun position, cloud cover, air pollution, and the like.

Because of the high number of installed modules M in a string S, the MPP regulator could exceed the maximum permissible value of the operating voltage. This is prevented by expanding the control algorithm by the condition that the predefined voltage value (1000 volts in the example here) must not be exceeded. This condition has priority over achieving an optimum power point MPP. In advantageous manner, an output is provided on the MPP regulator that causes the switch 15 to close if this condition is violated for any reason.

Figure 4:
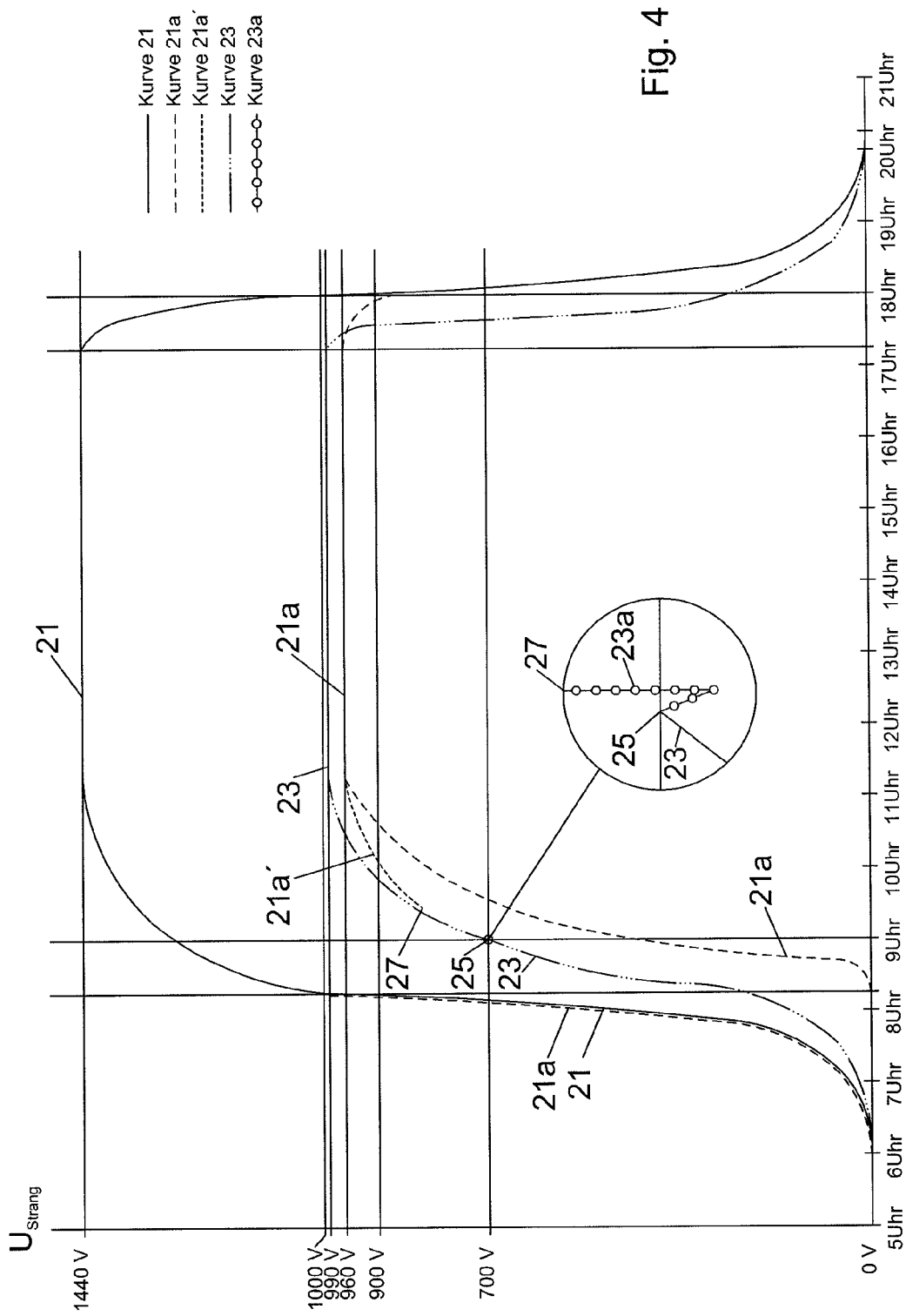
FIG. 4 illustrates a diagram of the morning startup behavior of a photovoltaic generator according to the invention.

FIG. 4 shows a typical curve of the voltage present at the string S during morning startup of the system 1. The illustrated course of the voltage as a function of the time of day is shown here by the curve 21 for the open-circuit case, and by the curve 21a with the inverter 11 connected in the operating case after it has been connected upon reaching the maximal permissible string voltage of 1000 volts in order to feed the energy that is generated into the grid through the output terminals 13. In this context, the curve 21a follows the open-circuit curve 21 until connection of the inverter. When 16 modules M per string S are used by way of example, the curve 21 trends toward the open-circuit voltage of approximately 1440 volts. Accordingly, the curve 21a under load approaches the operating voltage of 960 volts (corresponding to 16 times 60 volts). Also shown in the diagram in FIG. 4 is an additional curve 23, drawn with a dotted-and-dashed line, which shows the behavior of the open circuit voltage with the switch 15 closed, which is to say with the five modules M bridged in the example. Up to the point in time when the inverter 11 is connected, this curve 23 approaches the open-circuit voltage of the remaining eleven series-connected, active modules M, thus approximately 990 volts (corresponding to 11 times 90 volts).

At morning startup without short-circuited modules M, the result would be the behavior shown in curve 21, and the maximum permissible voltage level of 1000 volts would be reached at approximately 8:15 AM. Since the minimum power of 1 KW required for connection of the inverter 11 has not yet been reached, the voltage collapses and must be reestablished starting from zero as is shown by the behavior of the curve 21a from 8:15 AM onward. The minimum required power depends on the inverter 11 employed and can be approximately 15 KW for a 2.5 megawatt large-scale system. In like manner, a certain open-circuit voltage is necessary so that stable coupling of the inverter 11 to the grid can take place. In the exemplary embodiment shown in FIG. 4, it is assumed that the connection criteria are reached at a string voltage Ust of 700 volts when 11 modules M are present.

This is where the shorting switch 15 comes into action, the switch being switched on, which is to say closed, when the startup of the system begins. The photovoltaic system operates with eleven modules M per string S on the dotted-and-dashed line 23, and at approximately 9:00 AM reaches a power point 25 at which the minimum power of 1 KW required for stable connection to the grid has been reached. At this point in time, the string voltage Ust is 700 volts. Starting at this point in time, the switch 15 is opened, which results in a brief drop in the voltage; this is represented by the circled zigzag in the enlarged detail, since the MPP regulator cannot immediately compensate for this situation. In reality, the zigzag is only a few seconds in duration. The MPP regulator applies its regulating behavior and, in an extremely short time, brings the voltage Ust on the curve 23a to a point 27 on an operating voltage curve 21a' for the complete string S with all sixteen modules M. The curve 21a' is drawn with short dashes and runs parallel to and offset to the left of the curve 21a starting at the point 27. From that point, the curve 21a' approaches the maximum of 960 volts of the operating voltage Ust in the further course of the day as the sun stands higher. As a result, power is fed into the grid earlier than would have been possible without the switch 15. In the example shown, power feed to the grid begins at 8:45 AM, in contrast to which it would not have started until 9:20 AM with the photovoltaic system being operated along the curve.

The process is repeated in reverse order in the evening when the system 1 shuts down. Thus, in addition to the more favorable cable cross-sections, the invention also offers the further advantage of a more effective startup behavior in comparison to systems without shorting switches 15.

Figure 5:
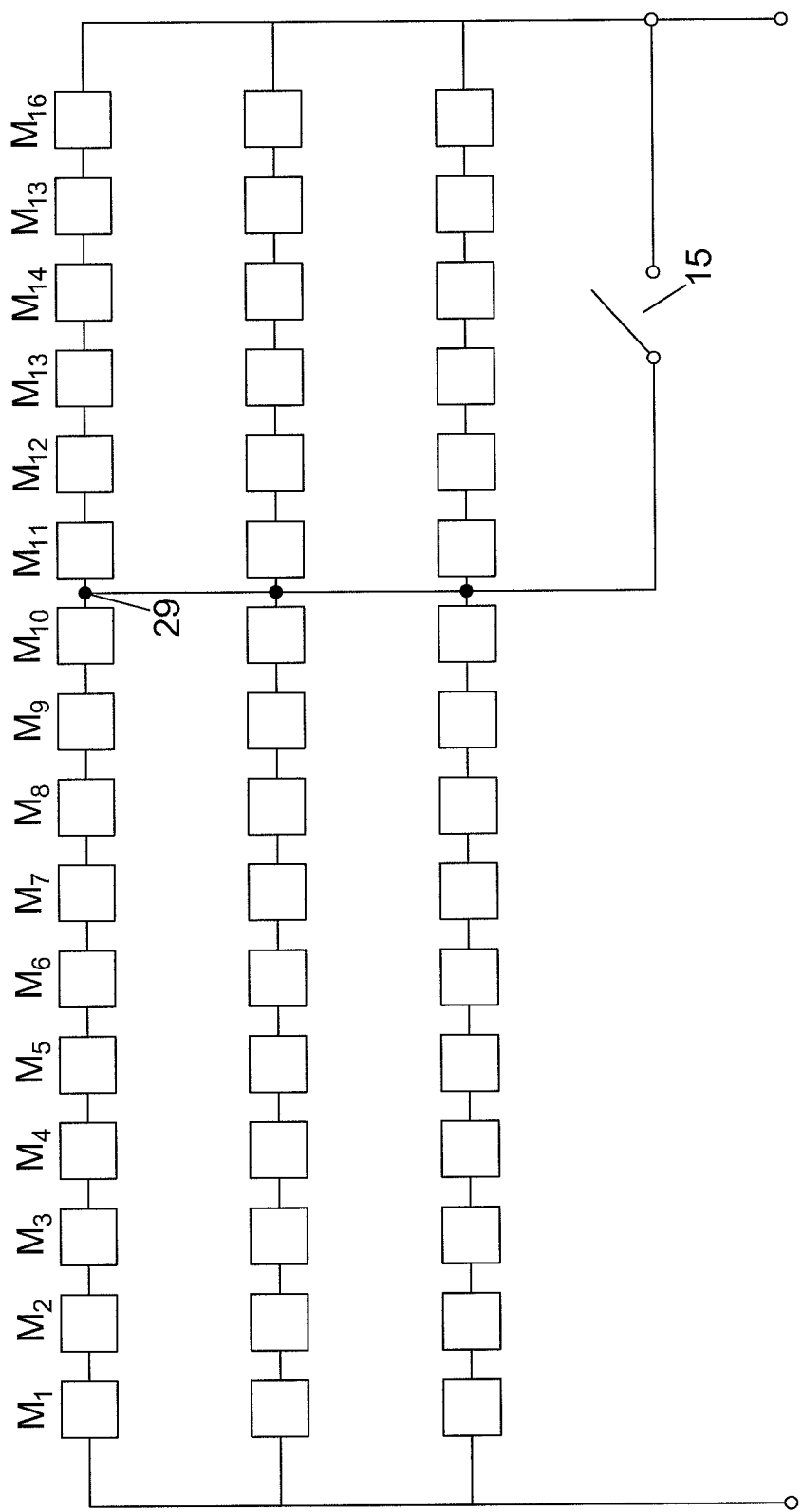
FIG. 5 illustrates a circuit arrangement for simultaneous switching of multiple interconnected strings.

FIG. 5 shows how six of the 16 modules M can be short-circuited in common for all strings S of the photovoltaic system. To this end, each of the line locations 29 located after the tenth module M are connected to one another and are then routed to the shorting switch 15.

Figure 6:
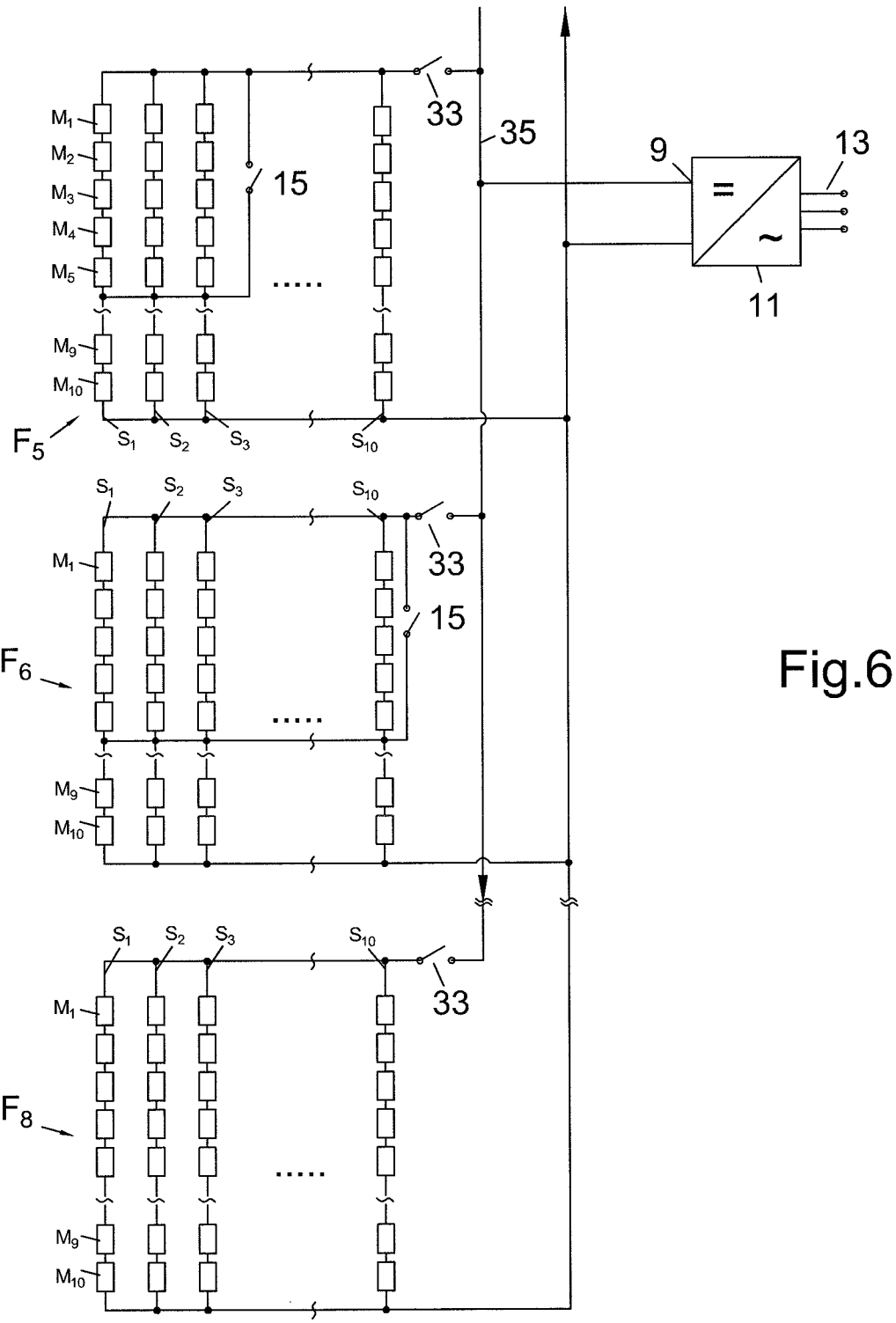
FIG. 6 illustrates a photovoltaic generator with multiple arrays according to the invention.

FIG. 6 shows the structure of a photovoltaic generator according to the invention which is provided with p=8 arrays $F_1$ to $F_8$, each with n=10 strings $S_1$ to $S_{10}$. The first array $F_5$, preferably the one that is closest to the inverter 11, is equipped with three strings S in accordance with FIG. 5, in which five modules M can be short-circuited by means of the shorting switch 15. In the adjacent, second array $F_6$, all strings S are equipped with the shorting switch 15. In the event of a short circuit on the AC side 13, the shorting switch or switches 15 is/are closed, and if adequate voltage limiting at the input side of the inverter 11 is not observed, disconnect switches 33, which connect the arrays F to a bus bar 35 leading to the input 9 of the inverter 11, are additionally opened. As many arrays F are provided with the shorting switch 15 as possible compensating currents between the arrays can be tolerated by the lines and the bus bar 35. If a further reduction in the voltage at the inverter input 9 should be necessary because the aforesaid drawing-down of the voltage is not sufficient to reach a safe input voltage at the inverter 11, the number of modules M per string S would have to be reduced, e.g. from 16 to 12.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A photovoltaic generator, comprising:
   a plurality of parallel-connected arrays, each array including multiple parallel-connected strings of series-connected photovoltaic modules;
   at least one shorting switch electrically coupled to only a portion of the photovoltaic modules of a string, the portion being at least two of the photovoltaic modules of the string, the at least one shorting switch configured to short-circuit the portion of the photovoltaic modules of the string based on a predefined voltage value across the string being exceeded,
   wherein only some of the arrays include a shorting switch, and
   wherein the arrays that include the shorting switch are located adjacent to an inverter.

2. The photovoltaic generator according to claim 1 wherein only a single array is equipped with a shorting switch.

3. The photovoltaic generator according to claim 1, further comprising a disconnect switch configured to electrically disconnect the arrays from an inverter.

4. The photovoltaic generator according to claim 1, wherein at least one shorting switch is a shared switch coupled to only a portion of the photovoltaic modules of multiple strings, the portion being at least two of the photovoltaic modules of each of the multiple strings, for short circuiting the photovoltaic modules of each of the multiple strings, and wherein each shared shorting switch interrupts or permits the flow of current to the photovoltaic modules of each of the multiple strings.

5. The photovoltaic generator according to claim 1, wherein at least one shorting switch is coupled to only half of the photovoltaic modules of a string, such that the at least one shorting switch is configured to only short-circuit the half of the photovoltaic modules of the string.

6. The photovoltaic generator according to claim 1, wherein at least two strings are equipped with one shorting switch each, the different shorting switches being coupled to different numbers of modules in the strings, such that the different shorting switches are configured to short circuit different numbers of modules in the strings.

7. The photovoltaic generator according to claim 1, further comprising a regulator for maximum power (MPP regulator) configured to generate an activation signal for the at least one shorting switch based on the predefined voltage value.

8. The photovoltaic generator according to claim 1, wherein the predefined voltage value is in a range from 900 volts to 1200 volts.

9. The photovoltaic generator according to claim 1, wherein one quarter to one half of all photovoltaic modules are coupled to a shorting switch.

10. The photovoltaic generator according to claim 1, wherein multiple strings having an equal number of photovoltaic modules are connected to one another, and a shared shorting switch is coupled to between one tenth and one half of the photovoltaic modules in the multiple strings to simultaneously short-circuit the between one tenth and one half of the photovoltaic modules in the multiple strings.

11. A photovoltaic generator, comprising:
   a plurality of parallel-connected arrays, each array including multiple parallel-connected strings of series-connected photovoltaic modules; and
   wherein only some of the arrays include a shorting switch electrically coupled to only a portion of the photovoltaic modules of at least one string, the portion being at least two of the photovoltaic modules of the string.

* * * * *